(12) United States Patent
Goruganthu et al.

(10) Patent No.: US 6,657,446 B1
(45) Date of Patent: Dec. 2, 2003

(54) PICOSECOND IMAGING CIRCUIT ANALYSIS PROBE AND SYSTEM

(75) Inventors: Rama R. Goruganthu, Austin, TX (US); Antonio Torres Garcia, Austin, TX (US); Michael R. Bruce, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,974

(22) Filed: Sep. 30, 1999

Related U.S. Application Data

(63) Continuation-in-part of application No. 09/205,589, filed on Dec. 4, 1999.

(51) Int. Cl.$^7$ .................... G01R 31/302; G01R 31/02; G01R 31/00
(52) U.S. Cl. .................... 324/752; 324/754; 324/96
(58) Field of Search ................ 324/752, 754, 324/537, 96, 753, 750, 751; 385/14; 438/32, 65, 69; 356/400, 401; 250/310, 311

(56) References Cited

U.S. PATENT DOCUMENTS

| | | | | |
|---|---|---|---|---|
| 4,775,640 A | * | 10/1988 | Chan | 324/758 |
| 4,891,580 A | * | 1/1990 | Valdmanis | 324/96 |
| 5,381,103 A | * | 1/1995 | Edmond et al. | 324/753 |
| 5,412,330 A | * | 5/1995 | Ravel et al. | 324/753 |
| 5,583,445 A | * | 12/1996 | Mullen | 324/754 |
| 5,631,571 A | * | 5/1997 | Spaziani et al. | 324/752 |
| 5,663,652 A | * | 9/1997 | Freeman | 324/96 |
| 5,723,982 A | * | 3/1998 | Yasue et al. | 324/754 |
| 5,751,157 A | | 5/1998 | Kister | 324/758 |
| 5,828,226 A | | 10/1998 | Higgins et al. | 324/762 |
| 5,940,545 A | * | 8/1999 | Kash et al. | 382/312 |
| 6,060,891 A | * | 5/2000 | Hembree et al. | 324/754 |
| 6,072,325 A | * | 6/2000 | Sano | 324/758 |
| 6,208,375 B1 | * | 3/2001 | Kay et al. | 348/95 |
| 6,374,003 B1 | * | 4/2002 | Ding et al. | 359/247 |
| 6,384,612 B2 | * | 5/2002 | Freund et al. | 324/750 |

FOREIGN PATENT DOCUMENTS

| | | | | |
|---|---|---|---|---|
| JP | 58209134 A | * | 12/1983 | |
| JP | 62031136 A | * | 2/1987 | 324/754 |

\* cited by examiner

*Primary Examiner*—Kamand Cuneo
*Assistant Examiner*—Jermele Hollington

(57) ABSTRACT

An apparatus, system, and method are provided for testing an integrated circuit with a probe card having optical fibers. The optical fibers of the probe card are fixed in alignment with test structures in the integrated circuit, and each optical fiber is coupled to an avalanche photo-diode for measuring photoemissions from the test structures. The photoemissions can be analyzed to verify correct circuit behavior. The optical fibers can be alternatives or complements to electrically conductive probes of the probe card.

14 Claims, 2 Drawing Sheets

PICOSECOND IMAGING CIRCUIT ANALYSIS PROBE AND SYSTEM

RELATED PATENT APPLICATIONS

This patent application is a continuation-in-part of the patent application entitled, "SINGLE POINT HIGH RESOLUTION TIME RESOLVED PHOTOEMISSION MICROSCOPY SYSTEM AND METHOD" by Bruce et al., filed on Dec. 4, 1999, and having application Ser. No., 09/205,589, and is related to the co-pending patent application entitled, "QUADRANT AVALANCHE PHOTODIODE TIME-RESOLVED DETECTION", by Bruce et al., filed on Sep. 30, 1999, and having application Ser. No. 09/409,088, now U.S. Pat. No. 6,483,327 issued Nov. 19, 2002, the contents of which are hereby incorporated by reference.

FIELD OF THE INVENTION

The invention relates to probe cards for testing integrated circuits, and more particularly to probe cards having optical fibers.

BACKGROUND OF THE INVENTION

Probe card assemblies generally include a probe card which is a printed circuit board having electrically conductive traces for carrying signals from contact pads formed on the integrated circuit. The probe card is interfaced with a programmed computer that generates test signals and senses responses from the integrated circuit. Electrically conductive probes are connected to the traces in the probe card and are arranged to be placed in electrical contact with the contact pads on the integrated circuit. Some assemblies also include an additional layer to transition from the low density probe card to a higher density of probes.

Problems recognized in the design of probe card assemblies include the unevenness of the contact pads, fatigue of probes, and misalignment of the probes caused by repetitive use. As integrated circuits become denser, the separation of contact pads is reduced and the challenges relating to the physical characteristics of the probe are increased. For example, as the probes become smaller, materials having higher conductivity must be used to compensate for the loss in probe size.

The increasing clock rate of integrated circuits is also creating design challenges for probe card assemblies. In particular, present circuits often run faster than 200 MHz, while probe card assemblies are designed to run much slower. An apparatus that addresses these problems is therefore desirable.

SUMMARY OF THE INVENTION

In various embodiments, the invention is a probe card having one or more optical fibers. Time-correlated single-photon-counting (TCSPC) techniques are used in one embodiment to detect a state change in a test structure of a circuit under test. Using optical fibers instead of traditional electrically conductive probes supports capture of device state changes that would be undetectable with traditional probes. In addition, the ability to detect a signal with an optical fiber is not dependent on establishing a good electrical contact between the fiber and a contact pad. Thus, positioning an optical fiber in order to detect a desired signal is not dependent on application of a suitable force to the fiber.

The above summary is not intended to describe each illustrated embodiment or every implementation of the present invention. The figures and the detailed description which follow more particularly exemplify these embodiments.

BRIEF DESCRIPTION OF THE DRAWINGS

The following detailed description of the preferred embodiments can best be understood when read in conjunction with the following drawings, in which.

Figure 1:
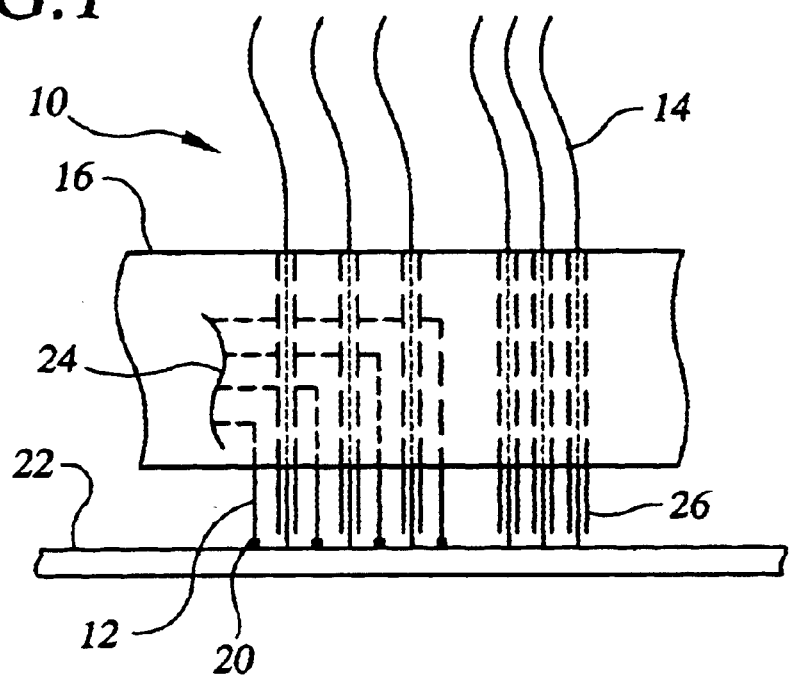
FIG. 1 illustrates a probe card constructed in accordance with one embodiment of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to front-side or backside analysis of a variety of circuits implemented on semiconductor wafers. While the present invention is not so limited, an appreciation of various aspects of the invention is best gained through a discussion of the example embodiments set forth below in which the front-side of a wafer is probed.

FIG. 1 illustrates a probe card constructed in accordance with one embodiment of the invention. Probe card 10 includes a plurality of probes 12, along with a plurality of optical fibers 14. Probes 14 and fibers 14 are held in fixed locations in probe card 10 by substrate 16.

Probes 12 are generally aligned with contact pads 20 of wafer 22. In one embodiment, the probes are exactly aligned with the contact pads and no additional apparatus is required during testing to properly align the probes with the contacts. In another embodiment, the probes in the substrate may be generally aligned and an alignment guide (not shown) is used to exactly align the probes with the contact pads during testing. Example probe and substrate structures can be found in U.S. Pat. Nos. 5,751,157 and 5,828,226 to Kister and Higgens et al., respectively.

Probes 12 are connected to electrical traces 24 in substrate 16. Test equipment (not shown) can be coupled to external contacts (not shown) that are connected to traces 24, as known in the art.

Probe card 10 also includes optical fibers 14 that are available for testing circuitry on wafer 22. Optical fibers 14 are used to collect photoemissions from test structures (not shown) formed within wafer 22. For example, it is known that CMOS transistors emit photons via hot carriers when driven into saturation. During a CMOS logic state change, the photon emission, primarily from n-MOS transistors, has been shown to occur transiently on picosecond time scales. This is particularly useful for analysis of ring oscillator test structures. As explained further below, integrated circuit structures can be tested using the photoemissions.

For each test structure to be tested within wafer 22, a separate optical fiber is disposed in a corresponding position within probe card 10. As with probes 12, a guide member (not shown) may be provided for exact alignment of the optical fibers with the test structures.

In one embodiment, fiber guides 26 are disposed at desired locations of probe card 10. The fiber guides provide accurate placement of the fibers in substrate 16 relative to the test structures and also provide lateral support for the fibers between substrate 16 and wafer 22. Hollow metal tubes or glass capillaries can be used to implement the fiber guides. Those skilled in the art will recognize other suitable materials. It is preferable that fiber guides 26 have blunt edges on the ends nearest the wafer in order to minimize damage if inadvertent contact is made. As an alternative to forming the fiber guides as within substrate 16, tubes could be wrapped around the substrate or probe pins and clamped or glued thereon.

It will be appreciated that the length of optical fibers 14 (extending from substrate 16 toward the wafer) will depend on the distance that separates the wafer and probe card when probes 12 are in electrical contact with contact pads 20, as shown in FIG. 1. It will be appreciated that the fibers need not directly contact the wafer, but can be disposed a small distance above the wafer and still collect photoemissions from the test structures. The length of fiber guides 26 extending from substrate 16 toward wafer 22 should be less than the length of the fibers in order to prevent contact between the fiber guides and the wafer.

As shown in FIG. 1, placement of optical fibers 14 within substrate 16 can be separate from probes 12 or interleaved therewith, depending on the relative placement of the test structures and contact pads of the wafer.

Figure 2:
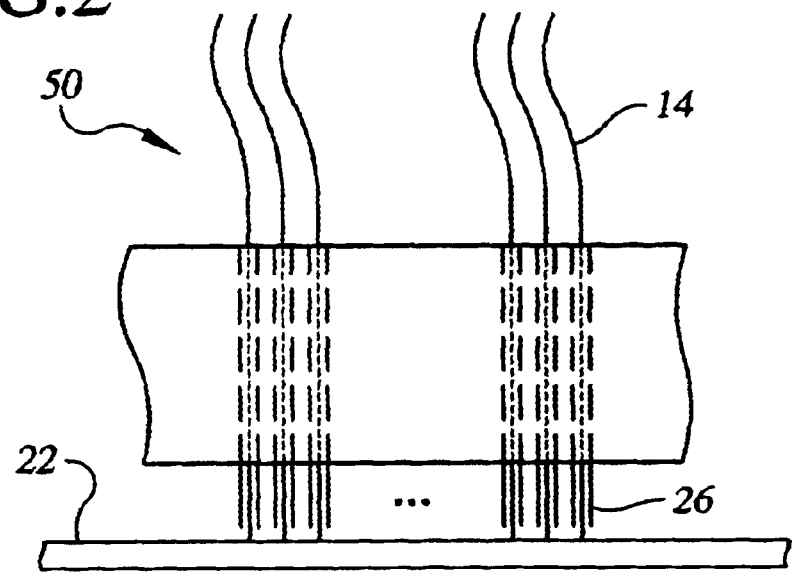
FIG. 2 illustrates a probe card constructed in accordance with another embodiment of the invention.

FIG. 2 illustrates a probe card constructed in accordance with another embodiment of the invention. Probe card 50 includes a plurality of optical fibers with no electrically conductive probes. With no electrically conductive probes and conductive traces, probe card 50 can be built to support the optical fibers without having to accommodate the electrically conductive structures. Thus, alternative structures and materials may be suitable for probe card 50 as compared to probe card 10. In another embodiment, an optical fiber could be attached to a thin metal wire, for example glued to a probe pin. It will be appreciated that the optical fibers need not pass through the probe card and could instead be attached to the surface of the probe card. Those skilled in the art of optical fiber connectors and carrier assemblies for optical fibers will recognize additional possibilities. Such carriers and connectors may also be used in combination with the embodiment of FIG. 1.

Figure 3:
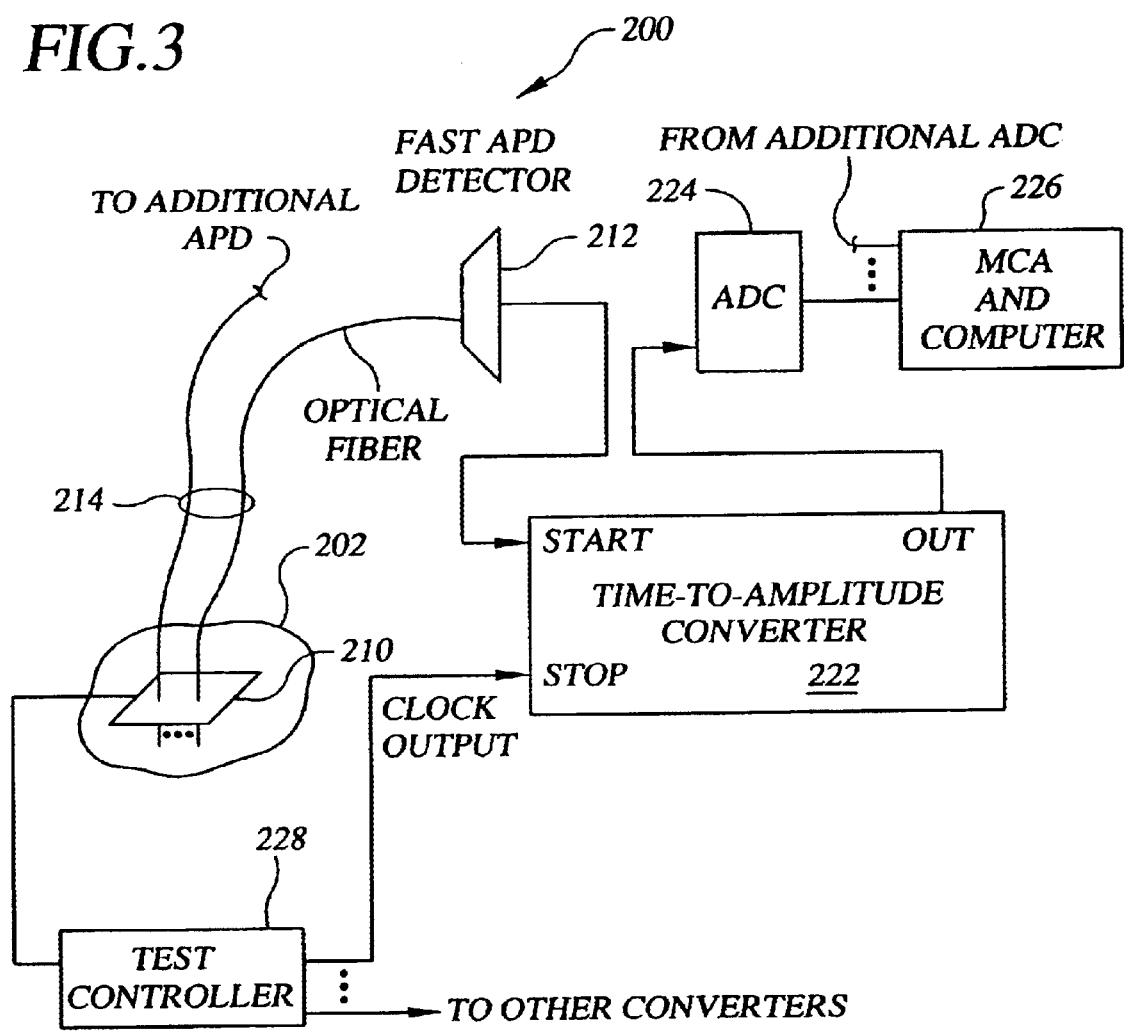
FIG. 3 is a block diagram of a system for time resolved photoemission detection using a probe card having optical fibers.

FIG. 3 is a block diagram of a system for time resolved photoemission detection using a probe card 210 having optical fibers. Each of optical fibers 214 is coupled to a respective avalanche photodiode (APD) detector 212 to detect photoemissions. The fiber optic cable 214 is a 0.002" glass fiber. Commercially available products are suitable, such as the model SPCM-QC4 fiber optic cable with an FC connector at one end and bare pig-tailed at the probe card end and an opaque PVC sheathing from EG&G Optoelectronics. The optical fibers need not provide transmission of coherent light. However such a cable could be used. The fibers 214 must be shielded with material that does not permit penetration of external light to the light transmitting fiber. In addition, a dark enclosure is desirable for the probe card and wafer under test.

APD detector 212 of the example embodiment provides high efficiency single-photon detection, for example the single photon counting module SPCM-AQ-151-FC from EG&G CANADA having a specified timing resolution of 300 ps. It will be appreciated that faster detectors can be used to analyze today's circuits in which devices, such as inverters, change state faster than 100 ps. In addition, as technology progresses and state changes occur at faster rates, even faster detectors can be used. Examples of other detectors that can be used include a photomultiplier such as the model 8852 from Burle Industries or the R3809U micro-channel plate photomultiplier tube (MCP-PMT) from Hamamatsu. Prototype detectors have been demonstrated having a timing resolution in the range of 20 ps. In another embodiment, a quadrant APD detector such as the C30927E series of quadrant APDs from the EG&G company, can be used to spatially resolve photoemissions as well as time-resolve the photoemissions.

Test controller 228 is coupled to wafer 202 for providing test signals as input to the circuit being tested. The test controller includes conventional hardware and software for configuring and loading test vectors circuit being tested.

A time-to-amplitude converter 222 is coupled to test controller 228 and to APD detector 212. The converter 222 generates an output pulse whose amplitude is directly proportional to the time between the start and stop pulses from the detector 212 and the test controller, respectively. The APD detector 212 generates a start pulse each time a photon is detected, and test controller 228 provides a clock signal which the time-to-amplitude converter 222 uses as a stop pulse.

The output pulse from the converter 222 is digitized by a conventional analog-to-digital converter 224, and the digitized pulse is provided as input data to a computer 226 via a multi-channel analyzer (MCA) card. The input data represents the pulse height of the pulse output from the converter 222. The computer/MCA analyzes the digitized pulse height and increases the count of a histogram data point, where the data point is selected based on the pulse height. For example, the pulse height represents a time interval in which the photoemission was detected. Thus, the count for that time interval is incremented upon detection of a photoemission.

The time-to-amplitude converter is, for example, a model TC862 from Oxford. Other suitable converters include the Canberra model 2145. In an alternative embodiment, a time-to-digital converter could be used in place of the time-to-amplitude converter 222 and ADC 224. An example time-to-digital converter is the model 1875 TDC that is available from Lecroy.

For each test structure of wafer 202 to be monitored, a separate parallel arrangement including an APD detector, a time-to-amplitude converter, and an ADC is required. Histograms of photoemissions from the respective test structures can be created based on the temporal relationships between output pulses of the respective photo-diodes and a clock signal that is output by test controller 228. Time-correlated single-photon-counting (TCSPC) techniques are used in the example embodiment.

Figure 4:
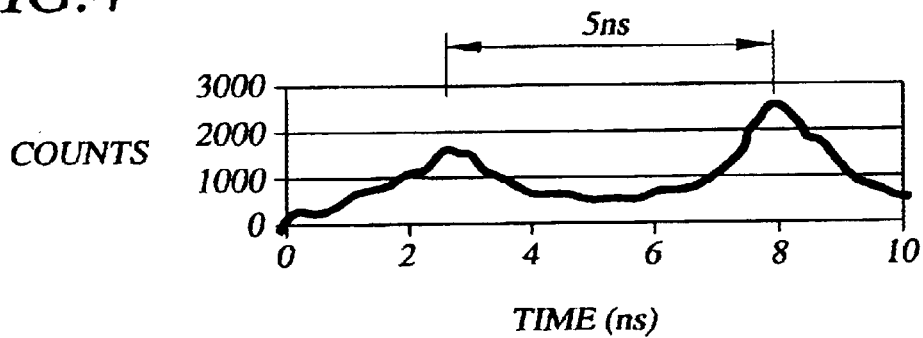
FIG. 4 is a graph of an example histogram of data compiled while detecting photoemissions from a test structure using time-correlated single-photon-counting techniques.

FIG. 4 is a graph of an example histogram of data compiled while detecting photoemissions from a test structure using time-correlated single-photon-counting techniques. The example histogram represents data compiled from a circuit that outputs a clock pulse every 2 ns, wherein each data point in the graph represents a count of photoemission events detected in a 12.5 ps interval.

The 5 ns interval between the peaks in the histogram illustrates the time interval between transitions of two inverters at an end of a ring oscillator. Given that the cycle time for an inverter is 10 ns in the example system, and photons are emitted only once during a cycle (e.g., going from a high logic level to a low logic level, but not in the transition from a low logic level to a high logic level), photons will be emitted every 5 ns by the two adjacent inverters.

Once photoemission data is collected, such as the example data of FIG. 4, timing specifications for the circuit can be analyzed and compared to the photoemission data to determine whether the circuit is functioning as expected.

Usage of conventional equipment in the example embodiments set forth above results in a system that is cost effective, yet highly functional.

As noted above, the present invention is applicable to analysis of a number of different semiconductor structures and arrangements. Furthermore, the invention may be implemented in various forms using equipment that is comparable to that identified herein. Accordingly, the present invention should not be considered limited to the particular examples described above, but rather should be understood to cover all aspects of the invention as fairly set out in the attached claims. Various modifications, equivalent structures, as well as numerous structures to which the present invention may be applicable will be readily apparent to those of skill in the art upon review of the present specification. The claims are intended to cover such modifications and devices.

What is claimed is:

1. A system for testing an integrated circuit, comprising:
   a test controller;
   a probe card having a combination of electrically conductive probes coupled to the test controller and one or more optical fibers aligned with one or more test structures in the integrated circuit, the probe card including a substrate having a plurality of electrical conductors, the electrically conductive probes being coupled to the electrical conductors and extending from the substrate, the one or more optical fibers being supported by the substrate;
   one or more photo-diodes optically coupled to the respective one or more optical fibers; and
   one or more counters coupled to the respective photo-diodes configured and arranged to time-resolve photo-emissions from the respective one or more test structures.

2. The apparatus of claim 1, further comprising a photo-multiplier tube coupled to one or more of the optical fibers.

3. The apparatus of claim 1, further comprising a microchannel plate photo-multiplier tube coupled to one or more of the optical fibers.

4. The apparatus of claim 1, wherein one or more of the one or more photo-diodes is an avalanche photo-diode.

5. The apparatus of claim 4, wherein one or more of the one or more avalanche photo-diodes is a quadrant avalanche photo-diode.

6. The apparatus of claim 1, wherein each counter includes a timer circuit coupled to the photo-diode to the test controller, the timer circuit arranged to provide an output signal indicative of time expired between a signal from the test controller and a signal from the photo-diode.

7. The apparatus of claim 6, further comprising a computer coupled to the timer circuit, and configured and arranged to record the output signal.

8. The apparatus of claim 6, wherein the timer circuit is a time-to-amplitude converter.

9. The apparatus of claim 8, further comprising an analog-to-digital converter coupled between the timer and the computer.

10. The apparatus of claim 9, further comprising a multi-channel analyzer board coupled to the analog-to-digital converter.

11. A process for testing an integrated circuit with a test controller, comprising:
   aligning a probe card with the integrated circuit, the probe card having one or more optical fibers aligned with one or more test structures in the integrated circuit and a plurality of electrically conductive probes aligned with respective contact pads of the integrated circuit, the probe card including a substrate having a plurality of electrical conductors, the electrically conductive probes being coupled to the electrical conductors and extending from the substrate, the one or more optical fibers being supported by the substrate;
   coupling the one or more optical fibers to one or more respective photo-diodes;
   applying electrical signals to the integrated circuit via the probes;
   detecting photo-emissions from the one or more test structures with the photo-diode; and
   measuring a duration of time between occurrence of a selected output signal from a test controller and an output signal from the photo-diode.

12. The process of claim 11, further comprising the step of generating a voltage at a level proportional to the duration of time between when a selected signal is output from the test controller and the photo-diode outputs a signal.

13. The process of claim 12, further comprising the step of coupling the photo-dioide and the integrated circuit to a time-to-amplitude converter.

14. The process of claim 13, further comprising the step of coupling the time-to-amplitude converter to a analog-to-digital converter and coupling the analog-to-digital converter to a computer.

* * * * *